(12) United States Patent
Roh

(10) Patent No.: US 6,661,725 B2
(45) Date of Patent: Dec. 9, 2003

(54) APPARATUS FOR STORING/RESTORING HOLOGRAPHIC DATA AND METHOD FOR CODING/DECODING HOLOGRAPHIC DATA

(75) Inventor: Jae-Woo Roh, Seoul (KR)

(73) Assignee: Daewoo Electronics Corporation (KR)

( * ) Notice: Subject to any disclaimer, the term of this patent is extended or adjusted under 35 U.S.C. 154(b) by 0 days.

(21) Appl. No.: 10/188,902

(22) Filed: Jul. 3, 2002

(65) Prior Publication Data
US 2003/0185077 A1 Oct. 2, 2003

(30) Foreign Application Priority Data
Mar. 28, 2002  (KR) ........................................ 2002-16894

(51) Int. Cl.[7] ................................................ G11C 7/00
(52) U.S. Cl. ........................ 365/216; 365/125; 341/106
(58) Field of Search ................................ 365/125, 216, 365/215; 359/21, 22; 341/106, 65

(56) References Cited

U.S. PATENT DOCUMENTS 5,319,629 A  *  6/1994  Henshaw et al. ........... 369/103
5,838,469 A  * 11/1998  Campbell et al. ............. 359/21
6,064,586 A  *  5/2000  Snyder et al. .............. 365/125
6,157,473 A  12/2000  Jang et al. .................... 359/22
6,346,897 B1  2/2002  Roh et al. ................... 341/106

FOREIGN PATENT DOCUMENTS

JP            0175463            3/2001

* cited by examiner

Primary Examiner—David Nelms
Assistant Examiner—Gene N. Auduong
(74) Attorney, Agent, or Firm—Anderson Kill & Olick, P.C.

(57) ABSTRACT

There is provided an apparatus for storing/restoring holographic data and a method for coding/decoding holographic data. In a recording mode, the apparatus divides input data into a plurality of groups, each of which includes two binary digits; and encodes each of the groups into a 2×2 data block wherein a first row of the 2×2 data block has the two binary digits and a second row thereof has another binary digits generated by applying a binary differential calculation on the first row. In a restoring mode, the apparatus divides a signal restored from a storage media into a plurality of 2×2 data blocks; and decodes each of the 2×2 data blocks into two binary digits by comparing values of a first row of the 2×2 data block with those of a second row thereof. In this way, phenomena of isolated "on" or "off" can be avoided.

7 Claims, 5 Drawing Sheets

<Isolated on>

<Isolated off>

APPARATUS FOR STORING/RESTORING HOLOGRAPHIC DATA AND METHOD FOR CODING/DECODING HOLOGRAPHIC DATA

FIELD OF THE INVENTION

The present invention relates to an apparatus for storing/restoring holographic data and a method for coding/decoding holographic data; and, more particularly, to an apparatus for storing/restoring holographic data and a method for coding/decoding holographic data, which improve a BER (bit error rate) by preventing isolated "on" or "off" phenomena from occurring in pixels of holographic data stored to or restored from a storage media.

BACKGROUND OF THE INVENTION

Recently, many researches on technologies for storing volume of holographic data have been under way by the help of a remarkable development of, e.g., a semiconductor laser, a CCD (charge coupled device), an LCD (liquid crystal display) and so on. Results of these researches are now being applied in such a field as a finger print recognition system, as well as any fields that take advantage of a large-scaled storage capability and a high-speed transmission rate.

A conventional holographic data storing/restoring apparatus stores an interference pattern, which is generated when an object beam for a target object interferes with a reference beam, into a storage media sensitive to an amplitude of the interference pattern, the storage media being made of, e.g., crystal. The apparatus stores data on an amplitude and a phase of the object beam by varying an angle of the reference beam, such that a three-dimensional shape of the target object can be represented on the storage media. In this way, the storage media can contain several hundreds or thousands of holograms, each of which is represented in the form of a page including binary digits.

In a recording mode, the conventional holographic data storing/restoring apparatus splits a laser beam from a light source into a reference beam and an object beam. And then, the object beam is modulated into binary data comprising pixels, each of which represents either light or shade of a target object, according to externally inputted data (i.e., input data to be stored). Next, an interference pattern is obtained through the interference of the modulated object beam (i.e., a signal beam) with the reference beam split from the laser beam and reflected from a mirror having a certain inclination. The interference pattern is stored in the storage media as holographic data corresponding to the input data.

In this case, the holographic data are multiplexed before being stored in the storage media. The multiplexing of the holographic data can be performed by using, e.g., an angle multiplexing, a wavelength multiplexing or a phase multiplexing.

In the meanwhile, in a reproducing mode, the conventional holographic data storing/restoring apparatus shuts out an object beam split from a laser beam. On the other hand, the apparatus irradiates a reference beam split from the laser beam to the storage media after the reference beam being reflected from a mirror at a predetermined angle. Thereafter, the irradiated reference beam is diffracted by employing the interference pattern stored in the storage media, such that a page of demodulated binary data can be obtained.

In this case, the reference beam, which is used in restoring the holographic data, has the same reflection angle as that of the reference beam used in storing the holographic data.

However, the conventional holographic data storing/restoring apparatus has a problem that, in general, an amplitude of a restored signal has a non-uniform distribution due to several factors such as a non-uniformity in an intensity of a laser beam, a distortion noise generated through a lens, and a scattering and a diffraction in the apparatus.

Meanwhile, a conventional method for coding/decoding holographic data uses a threshold value to distinguish between two binary digits, i.e., 0 and 1 when restoring holographic data stored in the storage media. The threshold value can be a fixed value, e.g., 0.5 or an average of pixels included in a page representing holographic data, or a local threshold that is locally determined.

In case the fixed value is used in decoding holographic data, a pixel included in the page is considered to be 1 when a level of the pixel is larger than a threshold value, i.e., the average or 0.5. On the other hand, the pixel is considered to be 0 when the level is smaller than the threshold value. The conventional coding/decoding method, which uses a fixed value as the threshold, is advantageous in that a high code rate can be obtained. However, it has a problem that a restoring error rate becomes higher for decoding data on an edge part of the page.

Meanwhile, the local threshold is determined as follows. First, a page representing holographic data is divided into several areas. And then, a different threshold value is set for each of the areas. That is, a higher threshold value is set for an area near the center of the page while a smaller threshold value is set for an area near the edge of the page. A pixel included in the page is considered to be 0 or 1, respectively, depending on a level of the pixel being smaller or larger than the threshold value.

In case the local threshold is used in decoding holographic data, both a high code rate and a low restoring error rate can be obtained. However, the restoring error rate may increase when an identical set of local thresholds is applied to coding/decoding systems, each of which has a different noise pattern depending on characteristics of the system and other environmental factors.

Alternatively, as a holographic data coding/decoding method for reducing the restoring error rate, a binary differential coding/decoding method can be used. The binary differential coding/decoding method encodes a sequence of binary digits by taking advantage of a characteristic that a level of a pixel representing a binary digit "1" is larger than that of a pixel representing a binary digit "0" in a local area. For example, binary digits "0" and "1" are encoded into "01" and "10", respectively. Further, decoding of the encoded binary digits is performed in reverse order of the coding process.

The conventional binary differential coding/decoding method is advantageous in that a low restoring error rate can be obtained, while it is disadvantageous in that a code rate is considerably low (50%).

Further, when binary digits are encoded by using the conventional binary differential coding/decoding method, as shown in FIGS. 5A and 5B, isolated "on" or "off" phenomena may occur in a part of a page. These phenomena may cause noises on the page stored in a storage media, which is due to a fact that the object beam modulated in accordance with the encoded binary digits is diffracted while passing through the spatial light modulator.

In this case, a portion of a laser beam corresponding to the isolated "on" spreads over its neighboring pixels, such that a laser beam intensity corresponding to the neighboring pixels increases while that corresponding to the isolated "on" pixel decreases. Further, a portion of the object beam corresponding to neighboring pixels of the isolated "off" spreads over the page, such that a laser beam intensity corresponding to the neighboring pixels decreases while that corresponding to the isolated "off" pixel increases.

In this situation, the isolated "on" pixel introduces relatively low laser beam intensity compared to a non-isolated "on" pixel. Also, the isolated "off" pixel introduces relatively high laser beam intensity compared to a non-isolated "off" pixel. Thus, a laser beam intensity for the isolated "off" (or "on") pixel may be considered to be higher (or lower) than those for neighboring "on" (or "off") pixels, which causes a restoring error rate to be higher.

SUMMARY OF THE INVENTION

It is, therefore, an object of the present invention to provide an apparatus for storing/restoring holographic data and a method for coding/decoding holographic data that improve a restoring error rate by removing isolated "on" or "off" pixels in a page representing the holographic data.

In accordance with one aspect of the present invention, there is provided an apparatus for storing/restoring holographic data, comprising: a light source for generating a laser beam; a beam splitter for splitting the laser beam into a reference beam and an object beam; a first grouping block for dividing input data into a plurality of groups, each of which includes two binary digits; a coding block for encoding each of the groups into a 2×2 data block wherein a first row of the 2×2 data block has the two binary digits and a second row of the 2×2 data block has another two binary digits generated by applying a binary differential calculation on the two binary digits included in the first row; a modulator for generating a signal beam by modulating the object beam in accordance with the 2×2 data block; a storage media for storing an interference pattern generated through an interference of the reference beam with the signal beam; a second grouping block for dividing a signal restored from the storage media into a plurality of 2×2 data blocks; and a decoding block for decoding each of the 2×2 data blocks outputted from the second grouping block into two binary digits by comparing values of a first row of the 2×2 data block with those of a second row of the 2×2 data block.

In accordance with another aspect of the present invention, there is provided a method for coding holographic data, comprising steps of: (a) dividing input data into a plurality of groups, each of which includes two binary digits; and (b) encoding each of the groups into a 2×2 data block wherein a first row of the 2×2 data block has the two binary digits and a second row of the 2×2 data block has another two binary digits generated by applying a binary differential calculation on the two binary digits included in the first row.

In accordance with still another aspect of the present invention, there is provided a method for decoding holographic data, comprising steps of: (a) dividing a signal restored from a storage media into a plurality of 2×2 data blocks; and (b) decoding each of the 2×2 data blocks into two binary digits by comparing values of a first row of the 2×2 data block with those of a second row of the 2×2 data block.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
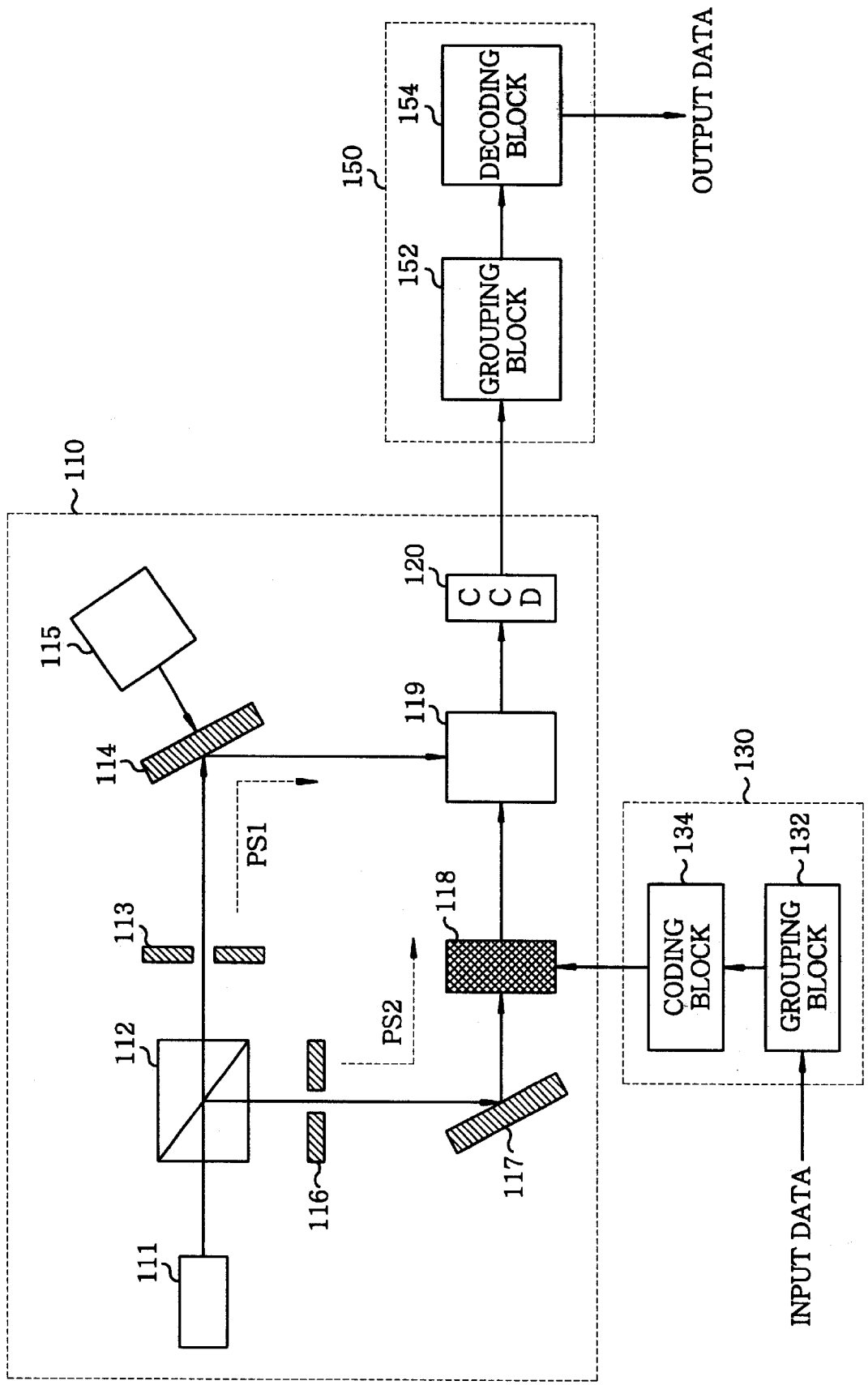
FIG. 1 depicts a block diagram of an apparatus for storing/restoring holographic data in accordance with the present invention.

FIG. 1 illustrates an apparatus for storing/restoring (or reproducing) holographic data in accordance with the present invention.

The apparatus includes a storing/restoring device 110, a data coding device 130 and a data decoding device 150.

Referring to FIG. 1, the storing/restoring device 110 has a light source 111 for generating a laser beam, a storage media 119 (e.g., a photorefractive crystal) for storing three-dimensional holographic data (i.e., interference patterns) and a CCD 120. Further, there are two processing paths, i.e., a path (PS1) for processing a reference beam and a path (PS2) for processing an object beam, between the light source 111 and the storage media 119. Each of the two paths includes a plurality of optical components thereon.

In the following, an operation of the apparatus in accordance with the present invention will be explained First, a beam splitter 112 splits a laser beam impinged thereon from the light source 111 into a reference beam and an object beam. The reference beam, which is vertically polarized, proceeds along the reference beam processing path (PS1). In the meantime, the object beam follows the object beam processing path (PS2).

Meanwhile, along the reference beam processing path (PS1), there are arranged a shutter 113, a mirror 114 and an actuator 115 in the direction of the reference beam irradiated. Through such a path, the reference beam is directed to the storage media 119 after being reflected from the mirror 114 at a predetermined angle.

Here, even though they are not illustrated in FIG. 1 for the sake of explanation, a plurality of optical lenses (e.g., a waist configuration lens and a beam expander) may be included on the reference beam processing path (PS1).

To put it in more detail, the vertically polarized reference beam split by the beam splitter 112 is directed to optical lenses (not illustrated) through an opening of the shutter 113. The reference beam is expanded at a beam expander (not illustrated) such that it covers over a size of the object beam expanded by another beam expander on the object beam processing path (PS2). Subsequently, the expanded reference beam is reflected from the mirror 114 at a predetermined angle (e.g., an angle determined to be suitable for storing input data or restoring recorded input data) to be impinged on the storage media 119.

Here, an inclination angle of the mirror 114 is controlled by the actuator 115 in such a way that a reflection angle of the reference beam can be changed page by page, each of pages including binary data to be stored in the storage media 119. In this way, several hundreds or thousands of holograms can be stored in the storage media 119.

In the meantime, along the object beam processing path (PS2), another shutter 116, another mirror 117 and a spatial light modulator 118 are arranged in the direction of irradiation of the object beam. The shutter 116 stays open or closed in a recording mode or in a restoring mode, respectively, in response to a control of a system control means (not illustrated).

Here, even though they are not illustrated in FIG. 1 for the sake of explanation, a plurality of optical lenses (e.g., a reimaging lens, a beam expander and a field lens) may be included on the object beam processing path (PS2).

To put it in more detail, the object beam split by the beam splitter 112 is impinged on the mirror 117 through an opening of the shutter 116. The object beam is reflected from the mirror 117 at a predetermined angle, and then is impinged on the spatial light modulator 118.

Subsequently, based on input data provided from the data coding device 130 (i.e., input data encoded in accordance with the present invention), at the spatial light modulator 118, the object beam reflected on the mirror 117 is converted into a page of binary digits, each of which represents a pixel corresponding to either light or shade of a target object. That is, if the input data is image data represented in the form of an image frame, at the spatial light modulator 118, the object beam is modulated into a signal beam representing the image frame. Thereafter, the signal beam is impinged onto the storage media 119 and synchronized with the reference beam that is reflected from the mirror 114, and impinged onto the storage media 119.

In the recording mode, in the storage media 119, there is stored an interference pattern which is obtained through the interference of the signal beam outputted from the spatial light modulator 118 with the reference beam reflected on the mirror 114. That is, according to the intensity of the interference pattern, an optical induction of moving charged particles arises in the storage media 119, through which the interference pattern representing a three-dimensional hologram can be recorded therein.

As shown in FIG. 1, the data coding device 130 includes a grouping block 132 and a coding block 134. The grouping block 132 converts externally inputted data (i.e., input data to be stored in the storage media) into a plurality of groups, each of which includes 2 binary digits (2 bits), to be transmitted to the coding block 134.

And then, the coding block 134 converts each of the groups into a data block having 2×2 binary digits. The encoded data blocks are packed into a page to be provided to the spatial light modulator 118.

Figure 2:
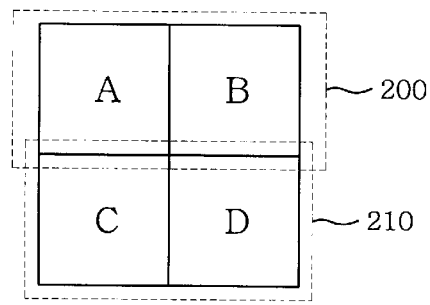
FIG. 2 charts a format of input data encoded in accordance with the present invention.

FIG. 2 describes an exemplary data block having 2×2 binary digits encoded by the coding block in accordance with the present invention. A first row 200 of the data block is a data row containing two binary digits (A, B) encoded by using a group of binary digits transmitted from the grouping block 132. A second row 210 of the data block is a reference row containing two binary digits (C, D) to be used in decoding the encoded binary digits contained in the first row 200.

The coding block 134 of the data coding device 130 encodes a group of input binary digits as follows.

First, a first row of a 2×2 data block is filled with the two input binary digits included in the group. And then, a first binary digit of a second row, i.e., a binary digit at the first column of the second row, is determined by applying binary differential calculation. That is, the binary digit at the first column of the second row is assigned an inverted value of the binary digit at the second column of the first row. Finally, a binary digit at the second column of the second row is determined such that a sum of all binary digits included in the 2×2 data block becomes 2.

Subsequently, in accordance with the binary digits included in the 2×2 data block, at the spatial light modulator 118, the object beam, which is reflected from the mirror 117, is modulated into a signal beam, i.e., a page of hologram. The signal beam is then impinged on the storage media 119, whereby the page of hologram is stored in the storage media 119.

In the meantime, in the restoring mode, the shutter 116 on the object beam processing path (PS2) is in a closed state while the shutter 113 on the reference beam processing path (PS1) is in an open state, which is accomplished by using the system control means (not illustrated).

Accordingly, a reference beam (a reference beam for restoring) split by the beam splitter 112 is reflected from the mirror 114 to be impinged on the storage media 119. As a result, by employing the interference pattern recorded in the storage media 119, the impinged reference beam is refracted to thereby produce a signal representing a page including demodulated binary digits. The demodulated signal is transmitted to the CCD 120.

Next, in the CCD 120, the demodulated signal irradiated from the storage media 119 is converted to an electrical signal, i.e., an original data. The restored signal is transmitted to a grouping block 152 of the data decoding device 150.

In the grouping block 152, the restored signal inputted from the CCD 120 is divided into a plurality of groups, each of which includes a 2×2 data block. Here, the 2×2 data block includes two rows of binary digits, wherein a first row (a data row) includes two binary digits to be restored and a second row (a reference row) includes another two binary digits to be referred in decoding the data row. Each of the groups is fed to a decoding block 154.

In the decoding block 154, the 2×2 data block is decoded by comparing a value at the first column of the data row (or at the second column of the data row) with that at the second column of the reference row (or at the first column of the reference row).

That is, at the decoding block 154, a value in the first column of the data row (or at the second column of the data row) is decoded as "1" when the value is larger than that at the second column of the reference row (or at the first column of the reference row). Further, the value in the first column of the data row (or at the second column of the data row) is decoded into "0" when the value is smaller than that at the second column of the reference row (or at the first column of the reference row).

Hereinafter, referring to FIGS. 3A to 3D, a procedure of coding/decoding a sequence of binary digits, e.g., "11" by using a coding/decoding method in accordance with a first preferred embodiment of the present invention will be explained.

First, as described above, at the grouping block 132, input data are divided into a plurality of groups, each of which includes two binary digits. Each of the groups is transmitted to the coding block 134 wherein the transmitted two binary digits (e.g., "11") are encoded to be outputted to the spatial light modulator 118.

Figure 3A:
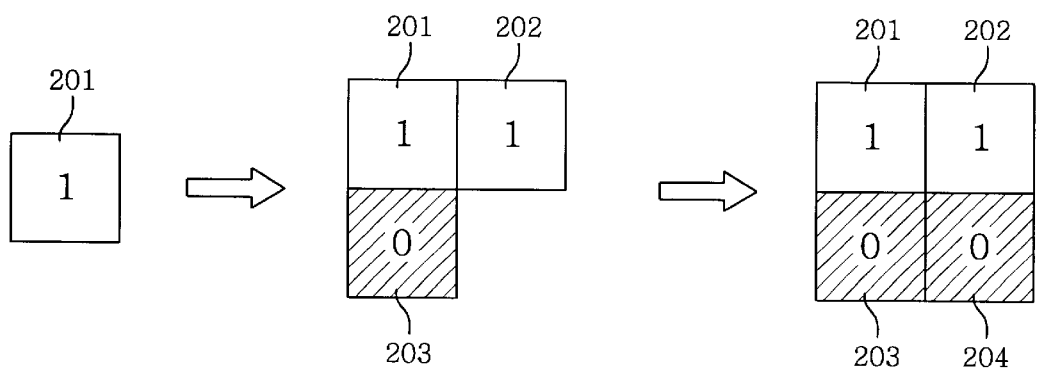
FIGS. 3A to 3D illustrate a process of encoding input data in accordance with another preferred embodiment of the present invention.

As shown in FIG. 3A, at the coding block 134, a first row of a 2×2 data block is formed by using the two binary digits "11". That is, each of a first pixel 201 and a second pixel 202 of the first row are assigned a binary digit "1". And then, a first pixel 203 of a second row of the 2×2 data block is assigned a binary digit "0" which is an inverted value of the pixel 202. Finally, at the coding block 134, a second pixel of the second row is set to be "0" such that a sum of all binary digits included in the 2×2 data block becomes 2.

Subsequently, in accordance with the binary digits included in the 2×2 data block, at the spatial light modulator 118, the object beam, which is reflected on the mirror 117, is modulated into a signal beam, i.e., a page of hologram. The signal beam is impinged on the storage media 119, whereby the page of hologram is stored in the storage media 119.

Figure 3B:
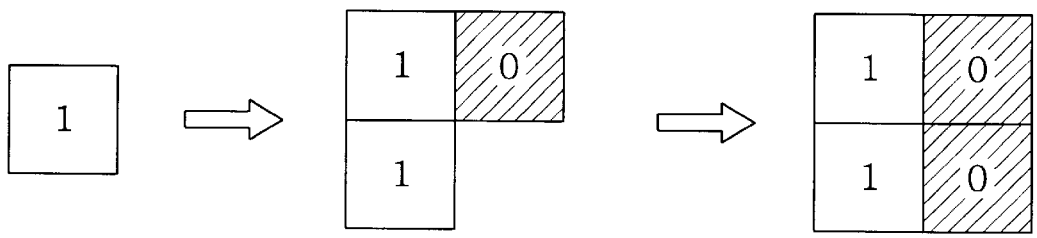
Figure 3C:
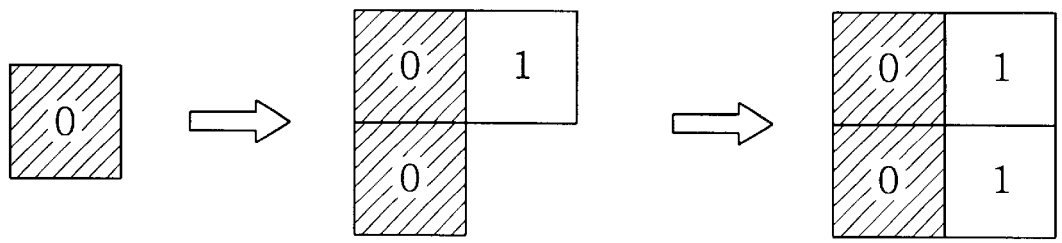
Figure 3D:
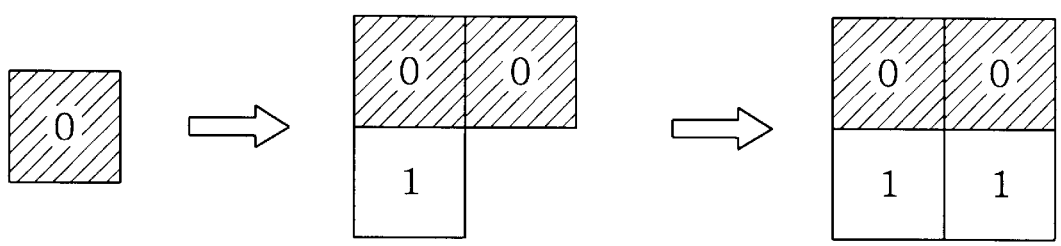

By using the above-described coding method, sequences of binary digits "10", "01" and "00" can be encoded into 2×2 data blocks, respectively, as shown in FIGS. 3B to 3D. In this way, an isolated "on" or "off" phenomena can be avoided when encoding a sequence of binary digits.

Decoding of the binary digits, which are encoded and stored in the storage media 119 in accordance with this embodiment of the present invention, is performed as follows.

First, at the grouping block 152, a restored signal inputted from the CCD 120 is divided into a plurality of groups, each of which includes a 2×2 data block. Here, the 2×2 data block includes two rows of binary digits, i.e., a data row and a reference data.

At the decoding block 154, a value at the first column of the data row (or at the second column of the data row) is decoded into "1" when the value is larger than that at the second column of the reference row (or at the first column of the reference row). Further, the value at the first column of the data row (or at the second column of the data row) is decoded into "0" when the value is smaller than that at the second column of the reference row (or at the first column of the reference row). In this way, at the decoding block 154, the 2×2 data block, which is previously encoded by the coding block 134, is decoded into "11".

In the following, referring to FIGS. 4A to 4D, a procedure of coding/decoding a sequence of binary digits, e.g., "11" by using a coding/decoding method in accordance with a second preferred embodiment of the present invention will be described.

First, at the coding block 134, a first pixel 301 of the data row is set to be the first binary digit, i.e., "1" of the group inputted from the grouping block 132. And then, a second pixel 304 of the reference row is assigned an inverted value, i.e., "0" of the first pixel 301 of the data row.

Next, at the coding block 134, a second pixel 302 of the data row is set to be the second binary digit, i.e., "1" of the group inputted from the grouping block 132. And then, a first pixel 303 of the reference row is assigned an inverted value, i.e., "0" of the second pixel 302 of the data row. As a result, a 2×2 data block including the data row and the reference row is obtained.

Subsequently, in accordance with the binary digits included in the 2×2 data block, at the spatial light modulator 118, the object beam, which is reflected from the mirror 117, is modulated into a signal beam, i.e., a page of hologram. The signal beam is impinged on the storage media 119, whereby the page of hologram is stored in the storage media 119.

Figure 4A:
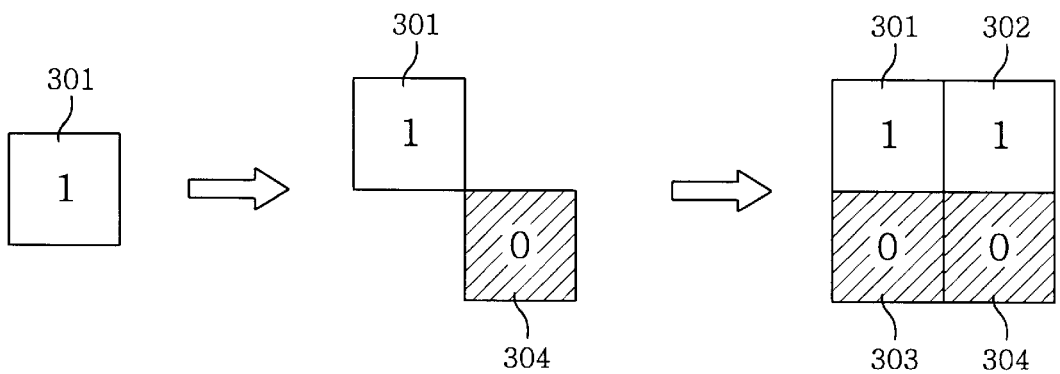
FIGS. 4A to 4D describe a process of encoding input data in accordance with still another preferred embodiment of the present invention.
Figure 4B:
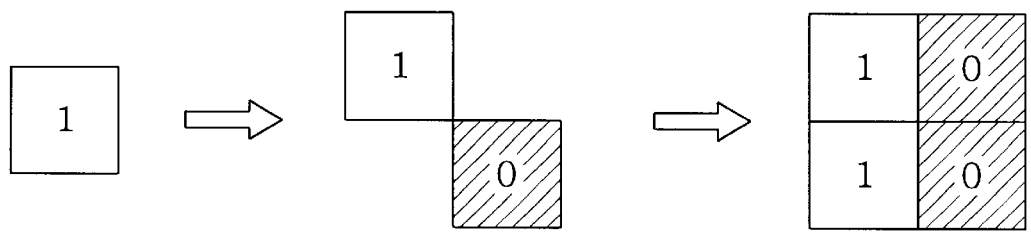
Figure 4C:
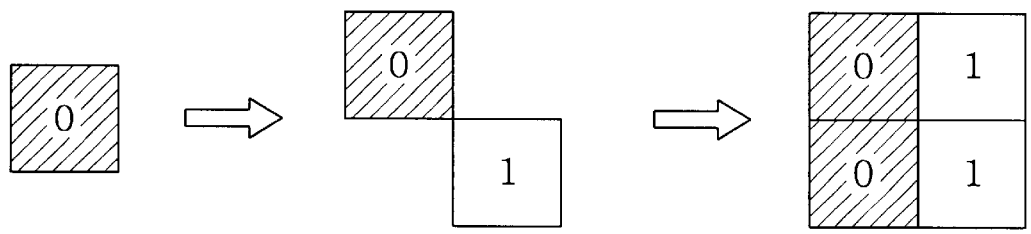
Figure 4D:
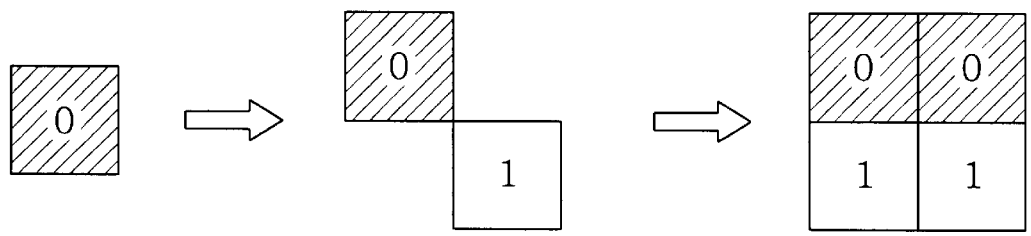
Figure 5A:
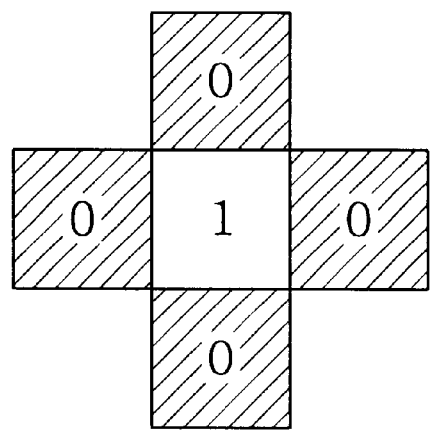
FIGS. 5A and 5B exemplify isolated "on" and "off" phenomena occurring when input data is encoded by using a conventional binary differential coding method.
Figure 5B:
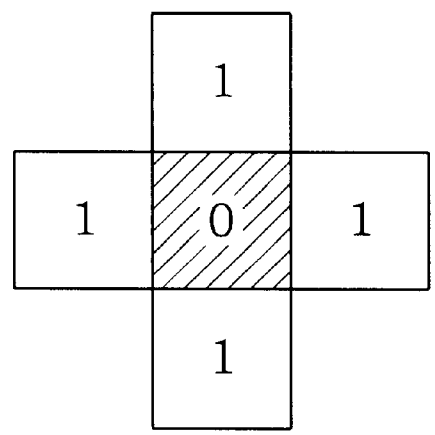

By using the above-described coding method, sequences of binary digits "10", "01" and "00" can be encoded into 2×2 data blocks, respectively, as shown in FIGS. 4B to 4D. In this way, an isolated "on" or "off" phenomena can be avoided when encoding a sequence of binary digits.

Decoding of the binary digits, which are encoded and stored in the storage media 119 in accordance with this embodiment of the present invention, is performed in the same way as that explained for the first embodiment of the present invention.

While the invention has been shown and described with respect to the preferred embodiments, it will be understood by those skilled in the art that various changes and modifications may be made without departing from the spirit and scope of the invention as defined in the following claims.

What is claimed is:

1. An apparatus for storing/restoring holographic data, comprising:
   a light source for generating a laser beam;
   a beam splitter for splitting the laser beam into a reference beam and an object beam;
   a first grouping block for dividing input data into a plurality of groups, each of which includes two binary digits;
   a coding block for encoding each of the groups into a 2×2 data block wherein a first row of the 2×2 data block has the two binary digits and a second row of the 2×2 data block has another two binary digits generated by applying a binary differential calculation on the two binary digits included in the first row;
   a modulator for generating a signal beam by modulating the object beam in accordance with the 2×2 data block;
   a storage media for storing an interference pattern generated through an interference of the reference beam with the signal beam;
   a second grouping block for dividing a signal restored from the storage media into a plurality of 2×2 data blocks; and
   a decoding block for decoding each of the 2×2 data blocks outputted from the second grouping block into two binary digits by comparing values of a first row of the 2×2 data block with those of a second row of the 2×2 data block.

2. The apparatus of claim 1, wherein at the coding block, a value at a second column of the second row is set to be an inverted value of a first column of the first row, and a value at a first column of the second row is set to be an inverted value of a second column of the first row.

3. The apparatus of claim 1, wherein at the decoding block, a value at a first column of the first row or at a second column of the first row is decoded into "1" when the value is larger than that at a second column of the second row or at a first column of the second row, respectively, and the value at the first column of the first row or at the second column of the first row is decoded into "0" when the value is smaller than that at the second column of the second row or at the first column of the second row, respectively.

4. A method for coding holographic data, comprising steps of:
   (a) dividing input data into a plurality of groups, each of which includes two binary digits; and
   (b) encoding each of the groups into a 2×2 data block wherein a first row of the 2×2 data block has the two binary digits and a second row of the 2×2 data block has another two binary digits generated by applying a binary differential calculation on the two binary digits included in the first row.

5. The method of claim 4, wherein, in the step (b), a value at a second column of the second row is set to be an inverted value of a first column of the first row, and a value at a first column of the second row is set to be an inverted value of a second column of the first row.

6. A method for decoding holographic data, comprising steps of:
   (a) dividing a signal restored from a storage media into a plurality of 2×2 data blocks; and (b) decoding each of the 2×2 data blocks into two binary digits by comparing values of a first row of the 2×2 data block with those of a second row of the 2×2 data block.

7. The method of claim 6, wherein, in the step (b), a value at a first column of the first row or at a second column of the first row is decoded into "1" when the value is larger than that at a second column of the second row or at a first column of the second row, respectively, and the value at the first column of the first row or at the second column of the first row is decoded into "0" when the value is smaller than that at the second column of the second row or at the first column of the second row, respectively.

* * * * *